(12) United States Patent
Mujica et al.

(10) Patent No.: US 8,306,149 B2
(45) Date of Patent: Nov. 6, 2012

(54) SYSTEMS AND METHODS OF POWER AMPLIFIER DIGITAL PRE-DISTORTION

(75) Inventors: Fernando Alberto Mujica, Allen, TX (US); Hardik Prakash Gandhi, Mountain View, CA (US); Lei Ding, Plano, TX (US); Milind Borkar, Dallas, TX (US); Zigang Yang, Plano, TX (US); Roland Sperlich, Dallas, TX (US); Lars Morten Jorgensen, Royal Oaks, CA (US); William L. Abbott, Portola Valley, CA (US)

(73) Assignee: Texas Instruments Incorporated, Dallas, TX (US)

( * ) Notice: Subject to any disclaimer, the term of this patent is extended or adjusted under 35 U.S.C. 154(b) by 470 days.

(21) Appl. No.: 12/571,435

(22) Filed: Oct. 1, 2009

(65) Prior Publication Data
US 2011/0080216 A1    Apr. 7, 2011

(51) Int. Cl.
*H04L 25/03* (2006.01)
*H04L 25/49* (2006.01)
(52) U.S. Cl. ............. 375/296; 375/297; 455/114.3; 708/316

(58) Field of Classification Search .......... 375/296, 375/297, 377, 229; 455/114.3; 708/300, 708/316
See application file for complete search history.

(56) References Cited

U.S. PATENT DOCUMENTS

| 2006/0171486 A1* | 8/2006 | Tan | 375/296 |
| 2008/0130787 A1* | 6/2008 | Copeland | 375/297 |
| 2008/0243899 A1* | 10/2008 | Staudinger et al. | 707/102 |
| 2008/0298500 A1* | 12/2008 | Norris et al. | 375/296 |

* cited by examiner

*Primary Examiner* — Betsy Deppe
(74) *Attorney, Agent, or Firm* — John J. Patti; Wade J. Brady, III; Frederick J. Telecky, Jr.

(57) ABSTRACT

An apparatus is provided. In the apparatus, an input to index (I2I) module maps a complex input into a real signal. A real data tap delay line is coupled to the I2I module and includes N delay-elements. A complex data tap delay line is configured to receive the complex input and includes M delay elements. A set of K of non-linear function modules is also provided. Each non-linear function module from the set has at least one real input, at least one complex input, and at least one complex output. A configurable connectivity crossbar multiplexer couples K of the N real tap delay line elements to real inputs of the set non-linear functions and couples K of the M complex tap delay line elements to complex inputs of the set non-linear function modules.

11 Claims, 12 Drawing Sheets

DPD IN (MODE 1,2,3)

FIG. 10B

DPD IN (MODE 4)

FIG. 10C

DPD OUT (MODE 1)

FIG. 10D

DPD OUT (MODE 3)

FIG. 10E

DPD OUT (MODE 2,4)

SYSTEMS AND METHODS OF POWER AMPLIFIER DIGITAL PRE-DISTORTION

TECHNICAL FIELD

The present disclosure is generally related to electronics and, more particularly, is related to power amplifiers.

BACKGROUND

Distortion may be considered to be an alteration of the original shape (or other characteristic) of an object, image, sound, waveform or other form of information or representation. Distortion is usually unwanted. In some fields, distortion is desirable, such as electric guitar (where distortion is often induced purposely with the amplifier or an electronic effect to achieve an aggressive sound where desired). The slight distortion of analog tapes and vacuum tubes is considered pleasing in certain situations. The addition of noise or other extraneous signals (i.e., hum, interference) is not considered to be distortion, though the effects of distortion are sometimes considered noise.

In telecommunication and signal processing, a noise-free "system" can be characterized by a transfer function, such that the output y(t) can be written as a function of the input x as $$y(t)=F(x(t))$$

When the transfer function comprises only a perfect gain constant A and perfect delay T, $$y(t)=A \cdot x(t-T)$$

the output is undistorted. Distortion occurs when the transfer function F is more complicated than this. If F is a linear function, for instance a filter whose gain and/or delay varies with frequency, the signal may experience linear distortion. Linear distortion will not change the shape of a single sinusoid, but will usually change the shape of a multi-tone signal.

A high-pass filter will distort the shape of a square wave by reducing its low frequency components. This is seen as "droop" on the top of pulses. This "pulse distortion" can be very significant when a train of pulses must pass through an AC-coupled (i.e., high-pass filtered) amplifier, for example. As the sine wave contains only one frequency, its shape is unaltered. A low-pass filter will round the pulses by removing the high frequency components. All systems may be considered low pass to some extent. Note that the phase of the sine wave is different for the lowpass and the highpass cases, due to the phase distortion of the filters.

A slightly non-linear transfer function, such as a gently compressing function of a tube audio amplifier, will compress the peaks of the sine wave. This will cause small amounts of low order harmonics to be generated. A hard-clipping transfer function will generate high order harmonics. Parts of the transfer function are flat, which indicates that all information about the input signal has been lost in this region.

The purpose of a power amplifier (PA) is to boost a radio signal to a sufficient power level for transmission through the air interface from the transmitter to the receiver. One goal in RF amplification is to achieve good linearity with reasonable efficiency by applying linearization techniques. An important goal in linearization is to apply external linearization to a reasonably efficient but non-linear PA so that the combination of the linearizer and PA satisfy the linearity specification. Linearization can be thought of as a cancellation of distortion components. There are several sources of distortion and the distortion generated in any of these sources can undergo subsequent mixing processes, resulting in higher order distortion components than the degree of the nonlinearity suggests.

Distortion may originally be generated in the form of current, which is converted to a voltage by terminal impedance. Thus the phase and amplitude of the distortion components can be strongly influenced by the terminal impedances, and especially by the impedances of the biasing networks. One distortion analysis technique is Volterra analysis, which is based on placing polynomial distortion sources in parallel with linear transfer functions. Benefits of this technique include the ease of identification of dominant sources of distortion; identification of phase relationships between distortion contributions; accuracy of a polynomial model for fitting to measured data; and the implementation of polynomial models in harmonic balance simulators.

SUMMARY

Examples of the present disclosure provide systems of power amplifier pre-distortion. Briefly described, in architecture, one example embodiment of the apparatus, among others, can be implemented as follows: an input to index sub-module that maps a complex input into a real signal; a real data tap delay line with Nr elements; a complex data tap delay line with Nc elements; a plurality K of non-linear functions, each non-linear function comprising at least one real input, at least one complex input and at least one complex output; and a configurable connectivity crossbar multiplexer that connects K of the Nr real tap delay line elements to real inputs of the K non-linear functions and that connects K of the Nc complex tap delay line elements to complex inputs of the K non-linear functions.

The present disclosure can also be viewed as providing methods for power amplifier pre-distortion. In this regard, one embodiment of such a method, among others, can be broadly summarized by the following: receiving a complex input, signal; mapping the complex input into a real signal; determining a number Nc of complex delay elements; determining a number Nr of real delay elements; determining a number K of non-linear function elements; applying the complex input signal to the Nc complex delay elements; applying the real signal to the Nr complex delay elements; applying the delayed real signal and delayed complex signal to the K non-linear function elements; combining the outputs of the K non-linear function elements; and transmitting the combined outputs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Non-constant envelope modulation schemes like those used in 3G and other emerging air interface standards are spectrally more efficient, but have high peak to average signal to noise ratios, necessitating a higher Power Amplifier (PA) back-off. This decreases PA efficiency, and increases the cooling and operational costs of a base-station, for example. The systems and methods of power amplifier pre-distortion disclosed herein present an efficient and flexible hardware implementation of a Volterra-based digital pre-distortion linearizer to provide efficiency enhancements for a variety of high power PA's. The adaptive digital pre-distortion solution presented herein extends the linear range of PA's and enables them to be driven harder and more efficiently while meeting transmit spectral efficiency and modulation accuracy requirements.

RF PA's exhibit highly complex non-linear behavior and can exhibit significant memory effects. This behavior varies considerably depending on the PA topology (including, but not limited to Class AB, Doherty, etc.), transistor technology (including, but not limited to LDMOS, GaN, GaAs, etc.), and transmit power levels. An efficient pre-distorter is preferably adaptable to the application and provides comprehensive coverage of all types of non-linear behavior.

A Volterra model may be effective at modeling the kind of non-linear behavior with memory exhibited by RF PA's. But for the memory depths and non-linear orders to be considered, a generic Volterra model becomes highly impractical for a real time pre-distorter. For a given PA type, a generic Volterra model can be highly pruned for a pre-distorter implementation without any noticeable degradation in linearization performance. Many digital pre-distorters may include a small sub-set of Volterra terms, usually only the diagonal terms (often called a memory polynomial pre-distorter).

A considerable improvement in performance may be found across a variety of commercial PA's by including a variety of Volterra cross-terms in addition to the diagonal terms in the pre-distorter. The cross-terms that provide benefit vary from PA to PA. Additionally, the pre-distorter memory depth and non-linear order required also vary from PA to PA.

The systems and methods of power amplifier digital pre-distortion disclosed herein may include a generic pre-distorter architecture which can implement a variety of Volterra cross terms involving single dimension convolutions (first order dynamics). For hardware implementations, this generic pre-distorter is further fine-tuned to provide a choice between different sets of cross terms that can be selected for a given PA for optimal performance. The novel pre-distorter architecture provides flexibility to trade off memory depth for additional Volterra terms and vice versa. A further novelty is the ability to trade off both memory depth and cross terms for a higher sample rate operation, which may enable higher order non-linear pre-distortion, or support for higher signal bandwidths. A poly-phase non-linear filtering mode allows for this flexibility.

The systems and methods of power amplifier digital pre-distortion disclosed herein may provide coverage over a vast range of Volterra terms while remaining easily implementable in hardware. The systems and methods of power amplifier digital pre-distortion disclosed herein may provide a variety of operational modes, including, but not limited to:

a) Long memory depth with limited number of cross terms;
b) Shorter memory depth with higher number of cross terms; and
c) Shorter memory depth and limited number of cross terms, but with support for higher sample rate operation, enabling higher non-linear order or higher signal bandwidths.

Figure 1:
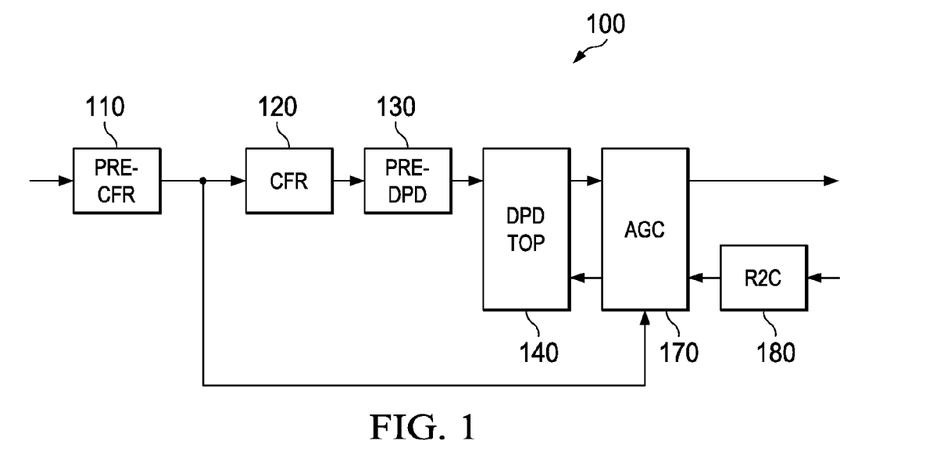
FIG. 1 is a block diagram of an example of a system of power amplifier pre-distortion used in an RF amplifier.

FIG. 1 provides block diagram 100 of digital pre-distortion in a class-D amplifier. A signal is input into pre-crest factor reduction (CFR) module 110 and interpolated by pre-CFR module 110. The output of pre-CFR module 110 is applied to CFR module 120 and automatic gain control module 170. The CFR module 120 reduces the peak-to-average ratio of the signal. The output of CFR module 120 is applied to pre-digital pre-distortion (pre-DPD) module 130 for further interpolation. The output of pre-DPD module 130 is applied to mixer and to DPD top module 140. The output of DPD top module 140 is applied to AGC 170 and to mixer 150. An input signal is applied to Real to Complex (R2C) module 180, which is used to set the gain level of AGC module 170.

Figure 2:
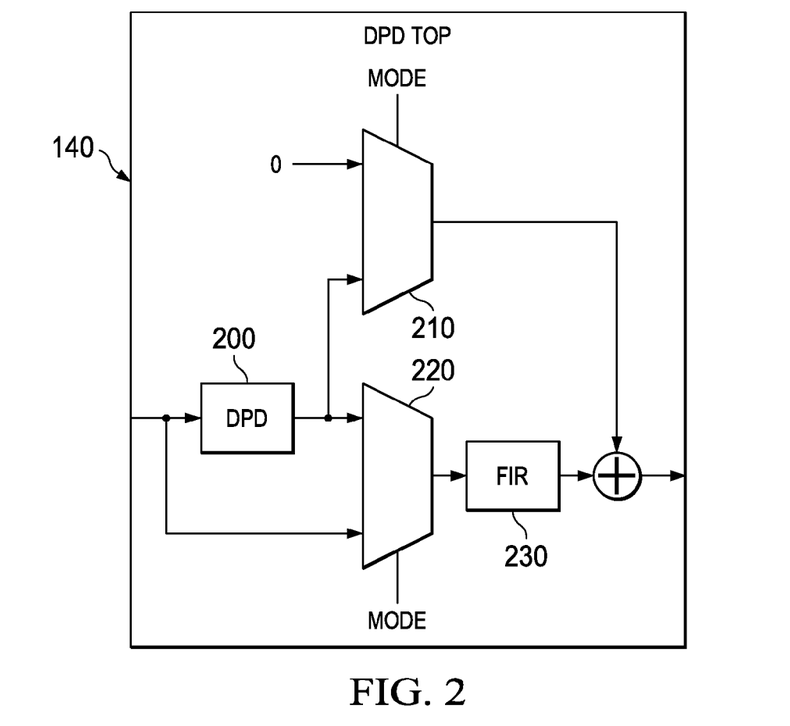
FIG. 2 is a block diagram of an example of the Digital Pre-distortion (DPD) cell of FIG. 1.

FIG. 2 provides a block diagram of DPD top module 140 from FIG. 1. As shown in this example, DPD top module 140 may comprise a DPD module 200 and an finite impulse response (FIR) filter module 230 that can be configured in either serial or parallel depending on signal MODE that is applied to the mode selectors or multiplexers 210 and/or 220. In operation, the output of pre-DPD module 130 is applied to DPD module 200 and first mode selector 220. The output of DPD module 200 is applied to first mode selector 220 and second mode selector 210. A mode selection signal MODE is applied to first mode selector 220 and second mode selector 210. The output of first mode selector 220 is applied to FIR filter 230. The output of FIR filter 230 and the output of second mode selector 210 are summed.

Figure 3:
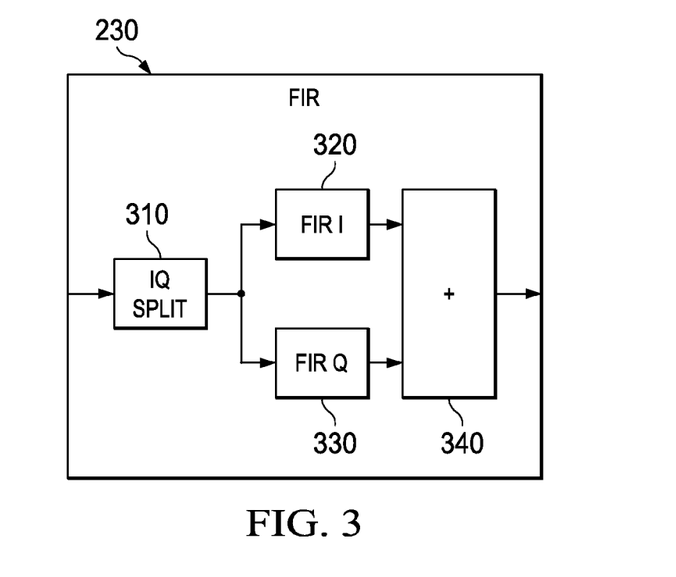
FIG. 3 is a block diagram of an example of the FIR filter of FIG. 2.

In FIG. 3, an example of FIR filter 230 of FIG. 2 can be seen in greater detail. As shown, the output of first mode selector 220 is applied to In-phase/Quadrature (IQ) splitter 310 in which the digital input is split into in-phase (I) and quadrature-phase (Q) components. The I components are applied to FIR I filter 320 and the Q components are applied to FIR Q filter 330. The outputs from filters 320 and 330 can then be combined by combiner 340.

Figure 4:
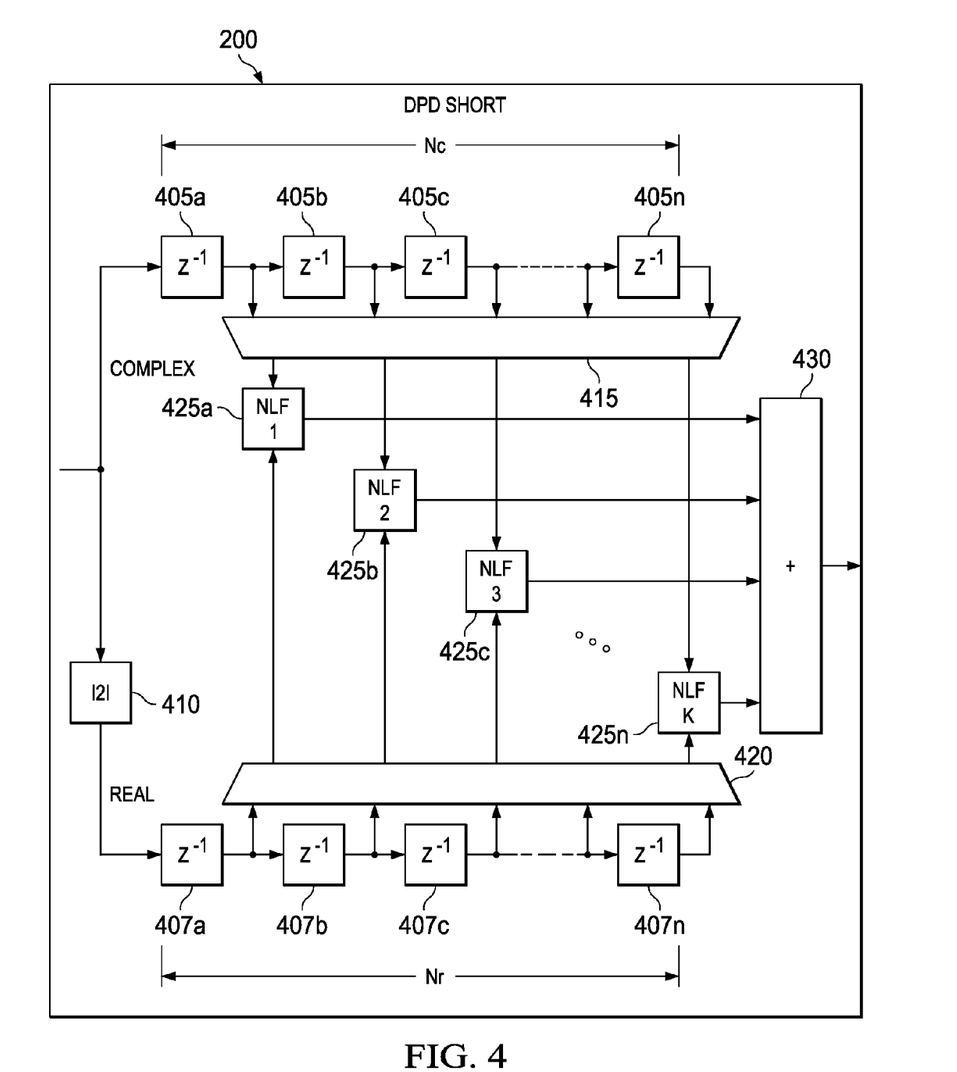
FIG. 4 is a block diagram of an example of the DPD cell of FIG. 2.

Turning to FIG. 4, a more detailed example of the DPD module 200 of FIG. 2 can be seen in greater detail. In DPD module 200, the input is split into real and complex inputs, where, for example, the input to index (I2I) module 410 can be used to map the complex input into a real signal. The complex datapath includes a string of delay elements 405a to 405n, which has several taps that are coupled to multiplexer 415 so as to receive complex inputs for nonlinear functions (NLF) 425a to 425n (which are each coupled to adder 430). The real datapath has delay elements 407a to 407n, which has several taps that are coupled to multiplexer 420 so as to receive real inputs for NLFx 425a to 425n. The parameters for this configuration can, for example, include Nc, Nr, and K, where: Nc is the number of complex taps; Nr is the number of real taps; K is the number of non-linear function (NLF) modules 425a to 425n. The connectivity multiplexers 415 and 420 on the complex and real paths, respectively, can be implemented as a fully connected crossbar in which each NLF has two indices for the top (nc,k) and bottom (nr,k) tap delay lines.

This example topology shown in FIG. 4 allows implementation of the following

Volterra terms:

$$y_5(n) = \sum_{k=1}^{K} NLF_k(|x(n - n_{r,k})|^2, x(n - n_{c,k}))$$

with $$0 < n_{c,k} < N_c$$

$$0 < n_{r,k} < N_r$$

An example of an NLF takes a complex input x (top) and a real input z (bottom) and may produce the complex output y (right) as follows:

$$y=f(z)x$$

with f( ) a complex valued function of a real value. There are multiple non-limiting options for the NLF implementation: (1) a look-up table (LUT) which may introduce relatively high latency to transfer coefficients from a digital signal processor (DSP); (2) a polynomial implementation with reduced latency to transfer coefficients from DSP, but with large complexity, inflexible in terms of order and basis functions; and (3) LUT+polynomial to LUT parameters (PTT) engine with reduced latency to transfer coefficients from DSP, flexible in terms of order and basis functions, but with moderate complexity. An example of the PTT engine takes polynomial coefficient, basis function parameters and LUT index to update; calculates the LUT parameters and updates the corresponding LUT. As an example, the LUT may be updated on the fly without interrupting the flow of information on the data path. An example embodiment of the polynomial implementation may include an approximation of the polynomial function with an interpolating LUT where linear interpolation is performed between the LUT entries to improve modeling accuracy. Example configurations of I2I module 410 include functions such as, but not limited to |•|2, |•|, Log 2(|•|2), μ-law, and LUT.

As an example, pre-distortion processing may be accomplished using a combination of DPD cells and equalizer cells. The DPD cells may be used to implement non-linear function terms; the equalizer (EQ) cells may be used to implement a transmit equalizer. The DPD and EQ cells may be configured in multiple modes as provided in FIGS. 5A, 5B, 5C, 6A, 6B, 6C, 7A, and 7B.

Figure 5A:
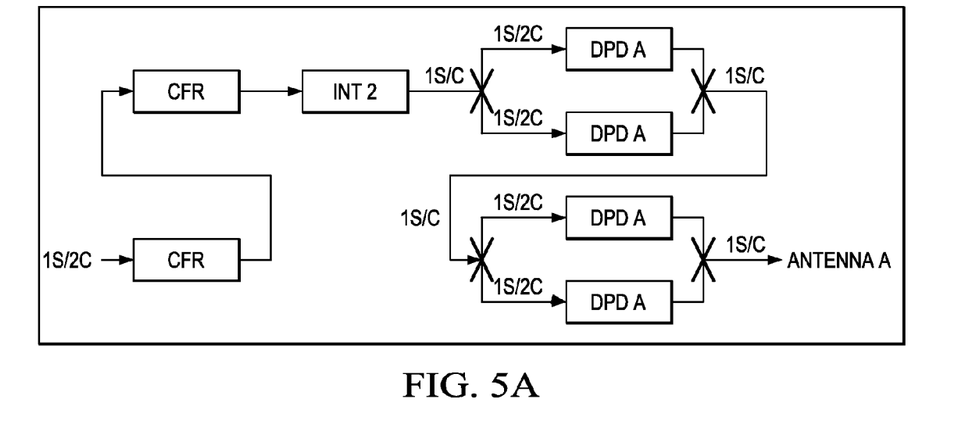
FIG. 5A is a block diagram of an example of a configuration of at least one DPD cell of FIG. 4.
Figure 5B:
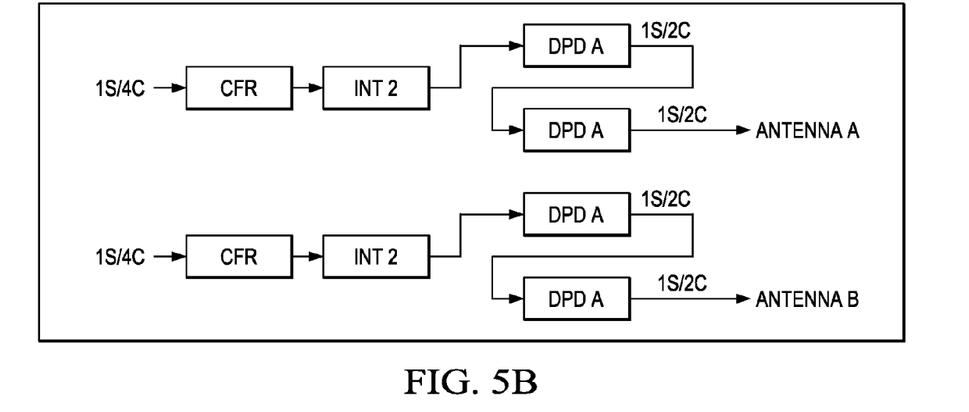
FIG. 5B is a block diagram of an example of a configuration of at least one DPD cell of FIG. 4.
Figure 5C:
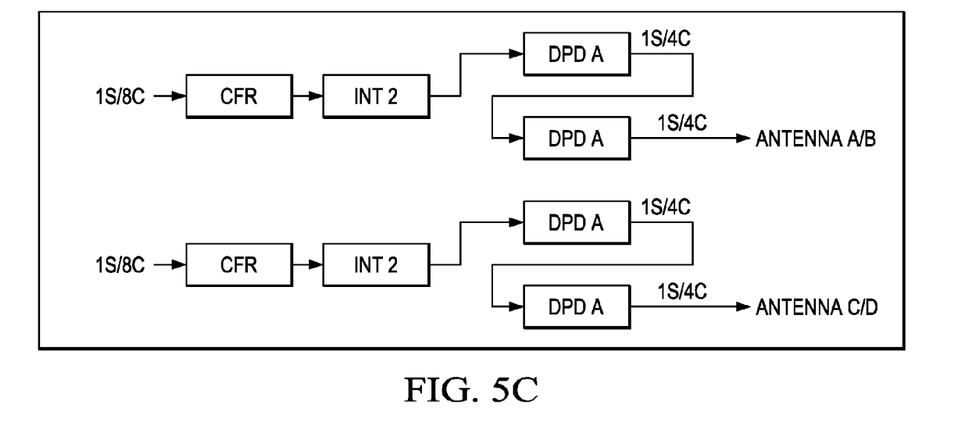
FIG. 5C is a block diagram of an example of a configuration of at least one DPD cell of FIG. 4.

In FIG. 5A, a one sample per two clock cycle example, the DPD cells are configured for five times bandwidth (BW) and double memory for a single antenna. In FIG. 5B, a one sample per four clock cycle example, the DPD cells are configured for five times BW and double memory for dual antennas. In FIG. 5C, a one sample per eight clock cycle example, the DPD cells are configured for five times bandwidth and double memory for four antennas. In FIGS. 5A-5C, the DPD cells are arranged sequentially, while the outputs of the summers in individual DPD blocks are added together, effectively computing one large filter with twice the memory.

Figure 6A:
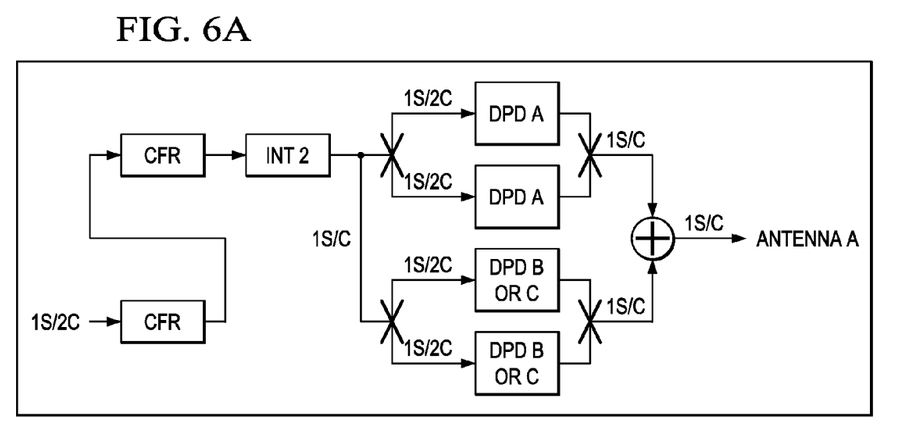
FIG. 6A is a block diagram of an example of a configuration of at least one DPD cell of FIG. 4.
Figure 6B:
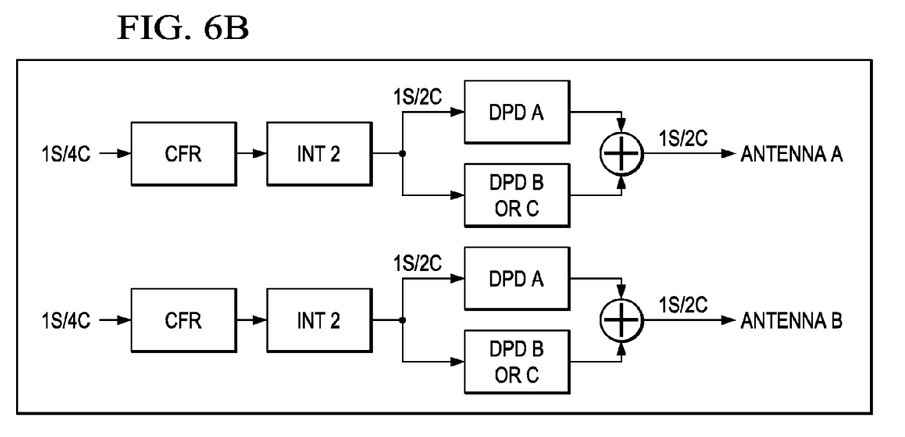
FIG. 6B is a block diagram of an example of a configuration of at least one DPD cell of FIG. 4.
Figure 6C:
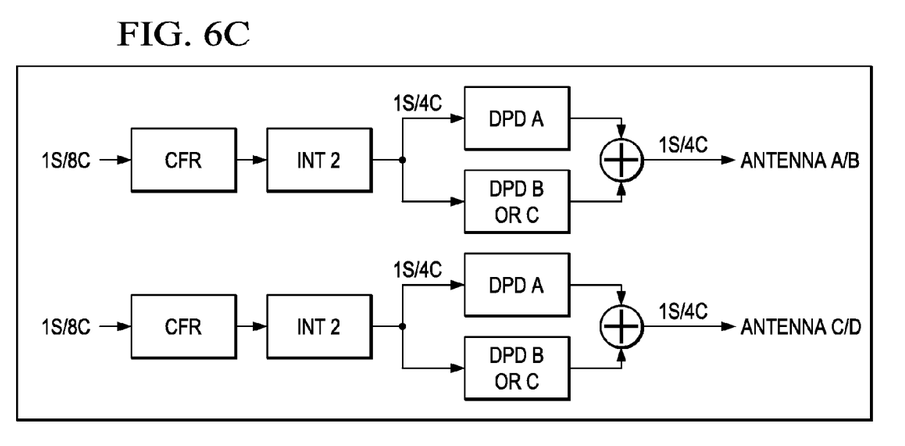
FIG. 6C is a block diagram of an example of a configuration of at least DPD cell of FIG. 4.

In FIG. 6A, a one sample per two clock cycle example, the DPD cells are configured for five times BW with increased cross terms compared to the configurations of FIGS. 5A-5C. FIG. 6A is configured for a single antenna. In FIG. 6B, a one sample per four clock cycle example, the DPD cells are configured for five times BW with increased cross terms compared to the configurations of FIGS. 5A-5C. FIG. 6B is configured for dual antennas. In FIG. 6C, a one sample per eight clock cycle example, the DPD cells are configured for five times BW with increased cross terms compared to FIGS. 5A-5C. FIG. 6C is configured for four antennas.

Figure 7A:
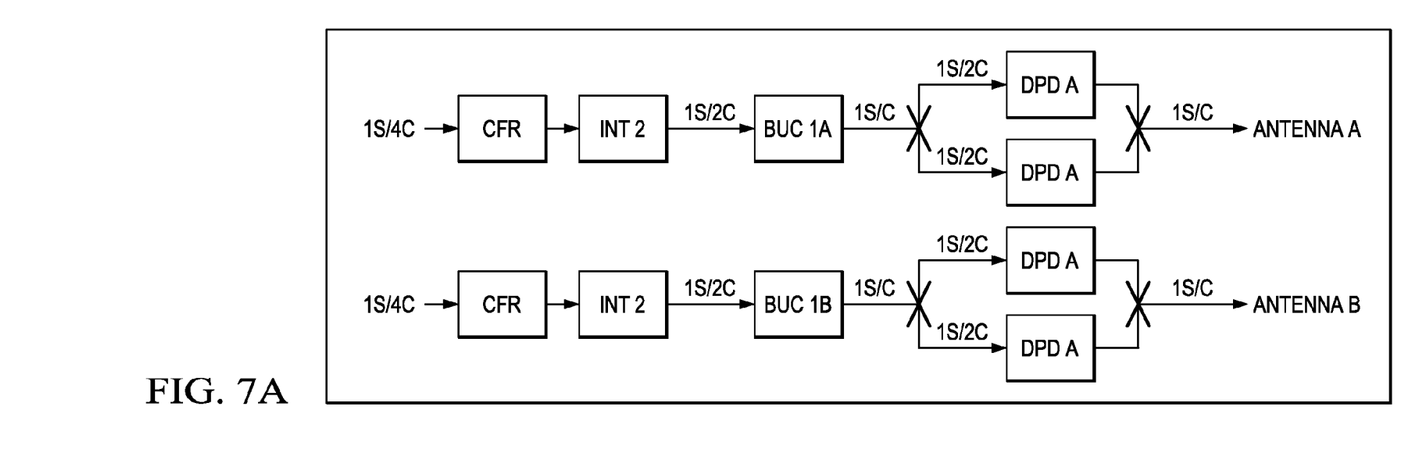
FIG. 7A is a block diagram of an example of a configuration of at least one DPD cell of FIG. 4.
Figure 7B:
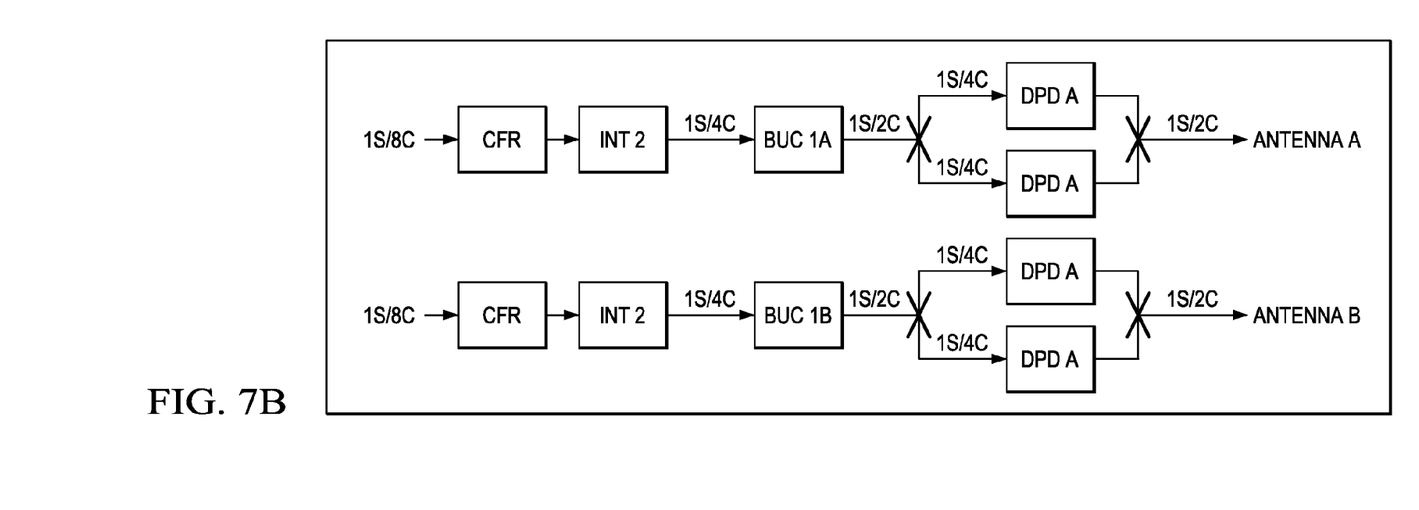
FIG. 7B is a block diagram of an example of a configuration of at least one DPD cell of FIG. 4.

In FIG. 7A, a one sample per four clock cycle example, the DPD cells are configured for ten times BW for two antennas. In FIG. 7B, a one sample per eight clock cycle example, the DPD cells are configured for ten times BW for two antennas.

Figure 8:
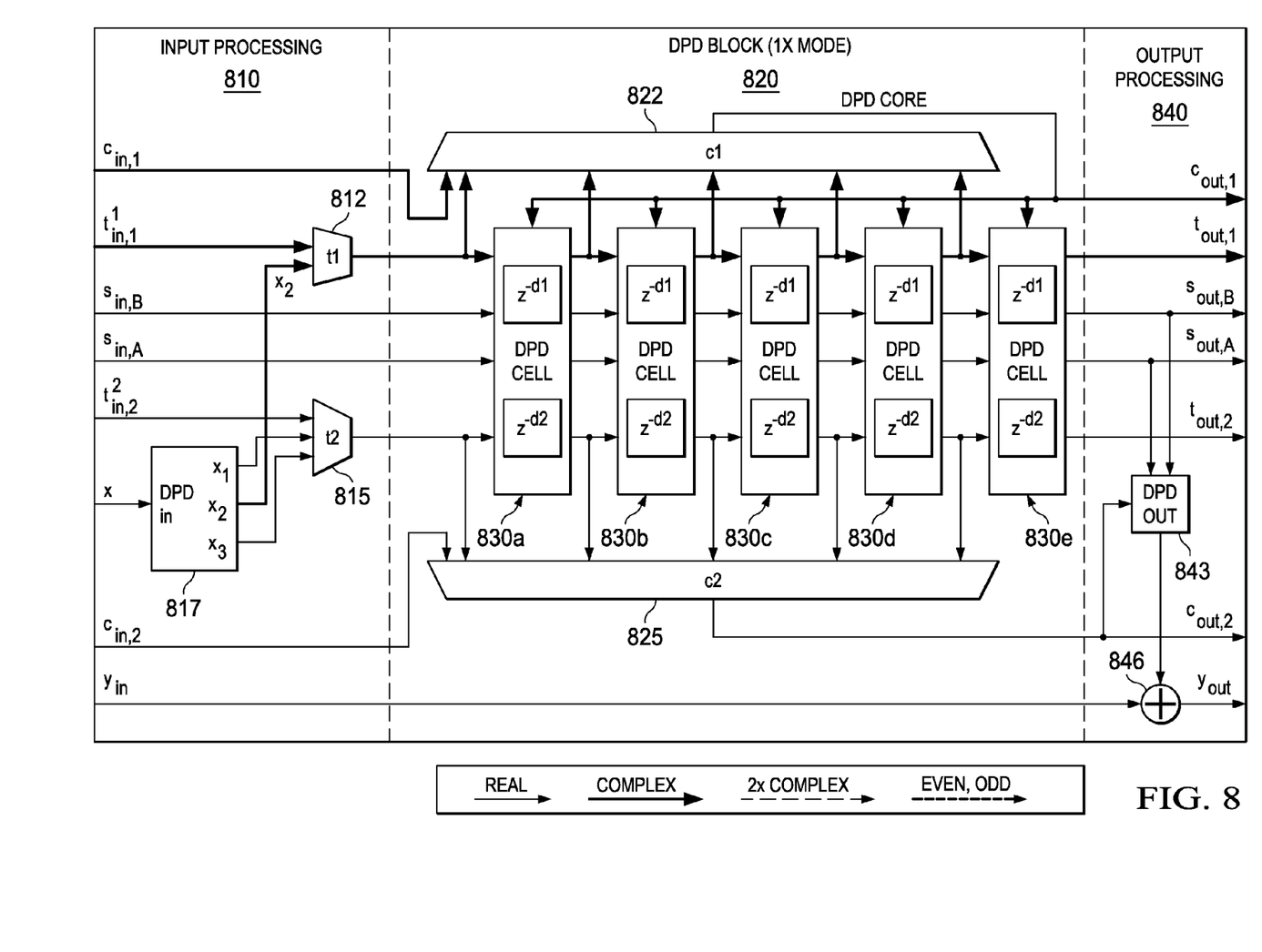
FIG. 8 is a block diagram of an example of a configuration of a DPD block in 1× mode.

FIG. 8 provides a system block diagram of an example of a system of digital pre-distortion with the cross connection as provided in FIG. 7A. As shown, the system generally comprises an input processing circuit 810 (with a multiplexers 812 and 815 and module 817), a DPD block 820 (with multiplexers 822 and 825, and DPD cells 830a-830e), and an output processing circuit 840 (with output circuit 843 and adder 846). Terms from DPD cells 830a-830e are multiplexed in multiplexer 822. As shown, FIG. 8 provides a 1× mode.

Figure 9A:
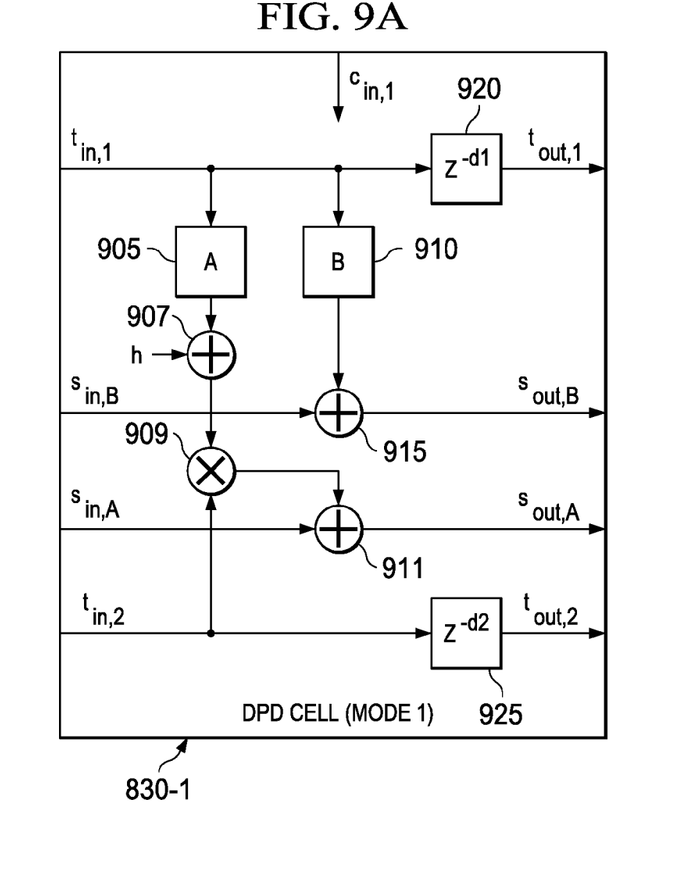
FIG. 9A is a block diagram of an example of a configuration of at least one DPD cell of FIG. 8.
Figure 9B:
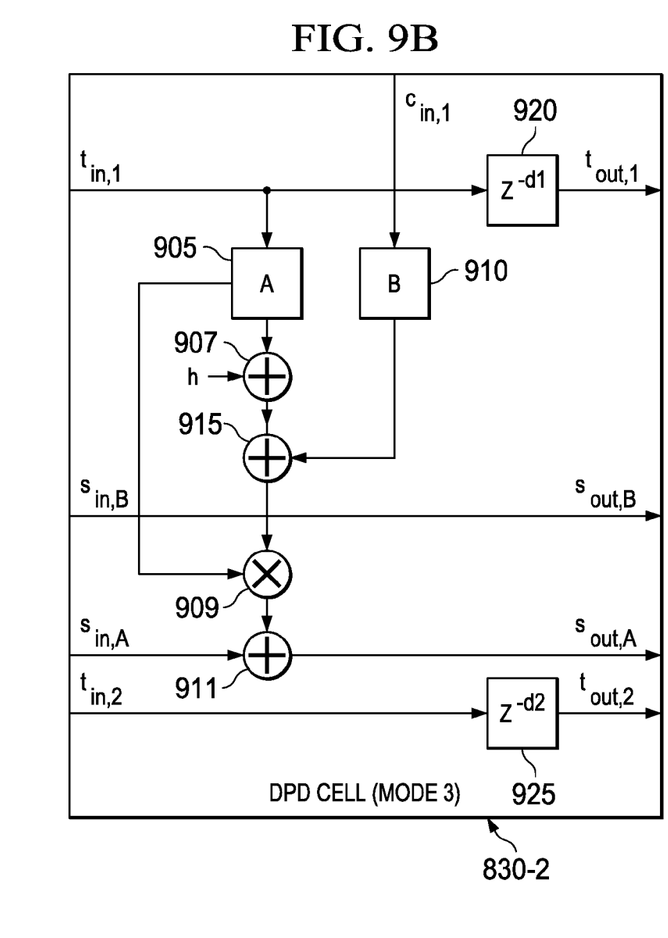
FIG. 9B is a block diagram of an example of a configuration of at least one DPD cell of FIG. 8.
Figure 9C:
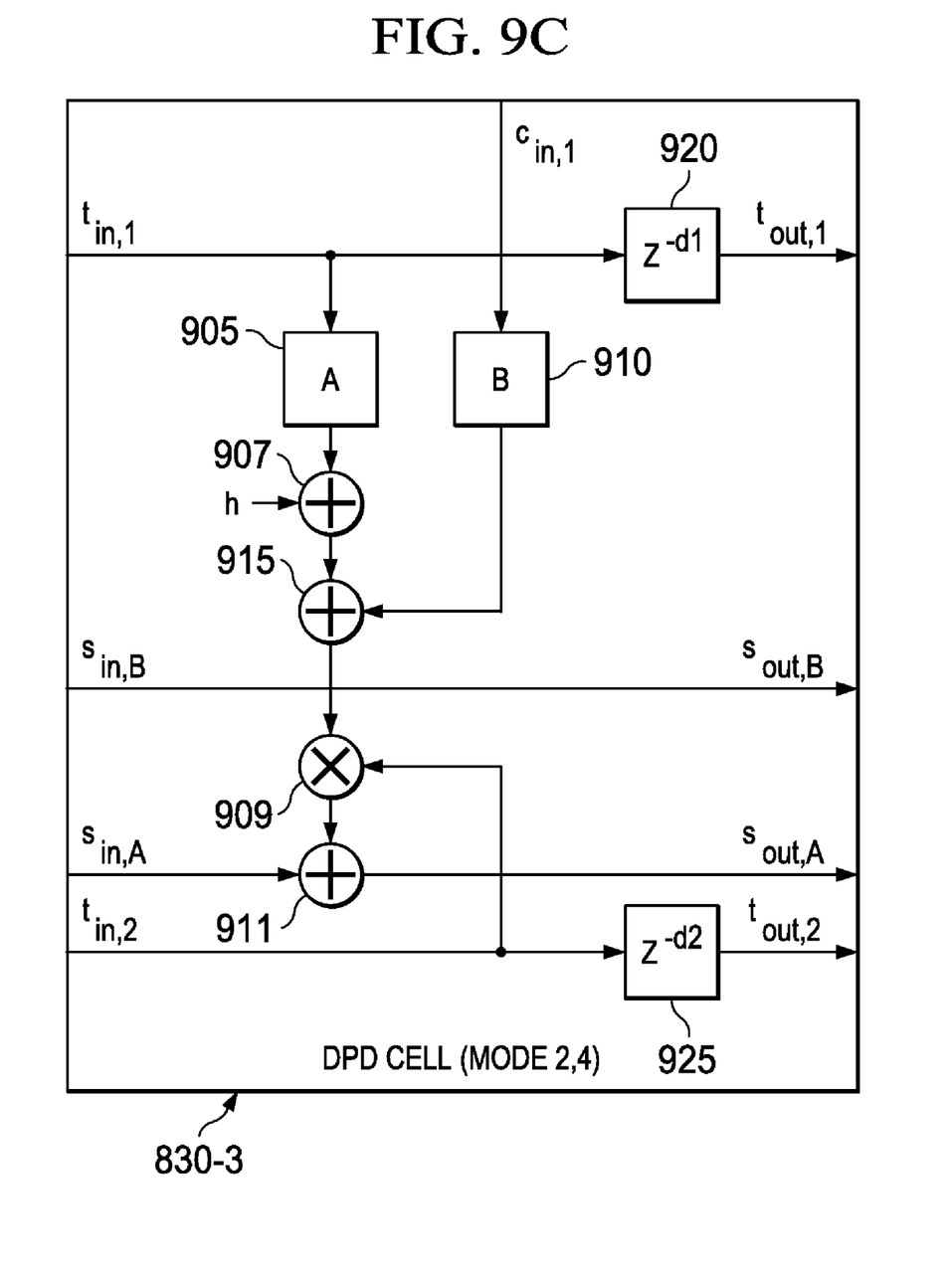
FIG. 9C is a block diagram of an example of a configuration of at least one DPD cell of FIG. 8.

FIGS. 9A-9C provide examples of the DPD cells of FIG. 8. FIG. 9A provides an example of DPD cells 830 in FIG. 8. As shown, cell 830-1, 830-2, and 830-3 operate in modes 2, 3, and 2/4, respectively. Cells 830-1 to 830-3 can comprise delay elements 920 and 925, lookup tables (LUTs) 905 and 910, summing circuits 907, 915, and 911, and multiplier or mixer 909. As shown in this example, delay elements 920 and 925 can generally correspond to complex delay elements (i.e., 405a) and real delay elements (i.e., 407a), respectively. Additionally multiplexers 822 and 825 (from FIG. 8) can respectively, correspond to 415 and 420, and non-linear function modules 425a to 425n can correspond to LUTs 905 and 910, summing circuits 907, 915, and 911, and multiplier or mixer 909.

Figure 10A:
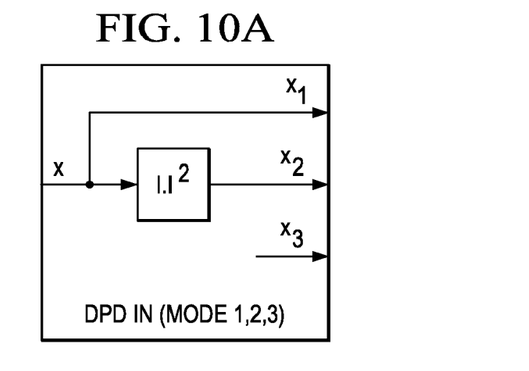
FIG. 10A is a block diagram of an example of an input block of the DPD block of FIG. 8.
Figure 10B:
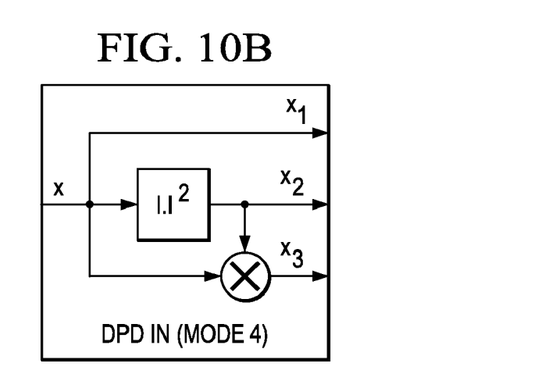
FIG. 10B is a block diagram of an example of an input block of the DPD block of FIG. 8.
Figure 10C:
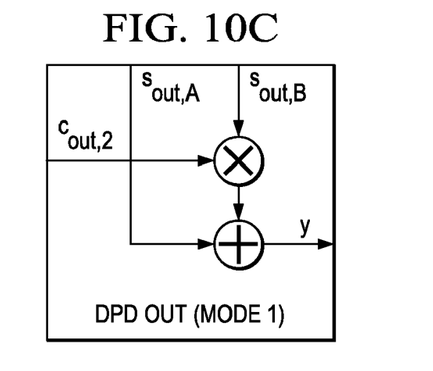
FIG. 10C is a block diagram of an example of an output block of the DPD block of FIG. 8.
Figure 10D:
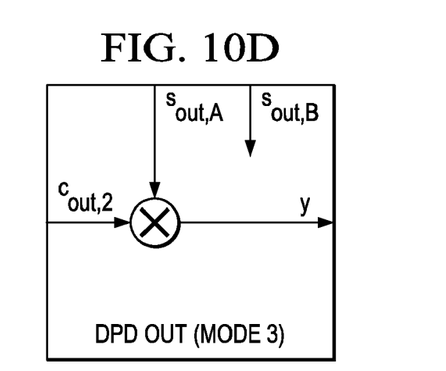
FIG. 10D is a block diagram of an example of an output block of the DPD block of FIG. 8.
Figure 10E:
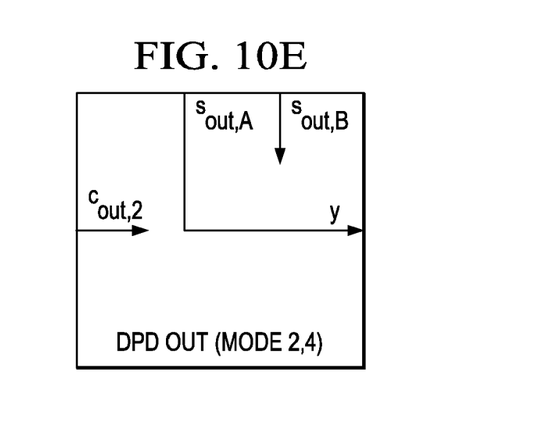
FIG. 10E is a block diagram of an example of an output block of the DPD block of FIG. 8.

FIGS. 10A and 10B provide examples of DPD input sub-modules. In FIG. 10A, modes 1, 2, and 3, corresponding to the DPD in module 817 in FIG. 8, produce x1, x2, and x3 outputs that feed the first DPD cell 830a in FIG. 8. In FIG. 10B, mode 4 in which x and x2 outputs are combined to produce x3 output, produce x1, x2, and x3 outputs that feed the first DPD cell 830a in FIG. 8. FIGS. 10C-10E provide example embodiments of DPD output sub-modules. Modes 1-4 implement different examples for nonlinear terms. The input and output sub-blocks provided in FIGS. 10A-E_aggregate common processing functionality to save hardware.

Figure 11:
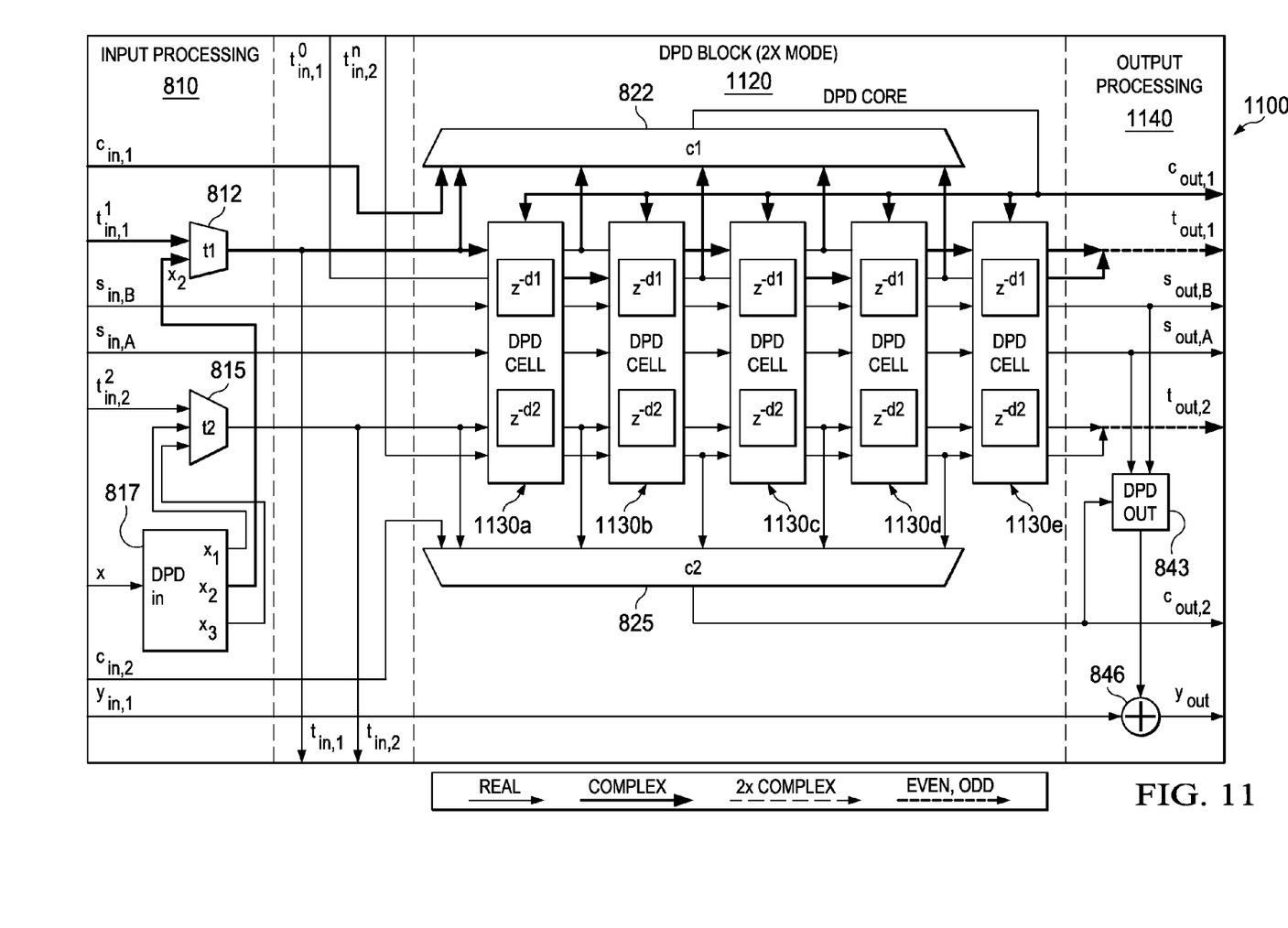
FIG. 11 is a block diagram of an example of a configuration of a DPD block in 2× mode.

FIG. 11 provides a system block diagram of an example of a system of digital pre-distortion with the cross connection as provided in FIG. 4. The example system shown in FIG. 11 is similar to the example system shown in FIG. 8, except that block 820 and 840 have been replaced with blocks 1120 and 1140 so as to operate in a 2× mode. The example of FIG. 11 is a modified mode of the example of FIG. 10 in which two DPD blocks work in tandem to operate in 2× mode with maximum cross term capability. In this configuration DPD cells 830a to 830e are replaced with cells 1130a to 1130e so as to use $t_{in,1}^0$ and $t_{in,2}^2$, where $t_{in,1}$ and $t_{in,2}$ can be even, odd signals.

Figure 12:
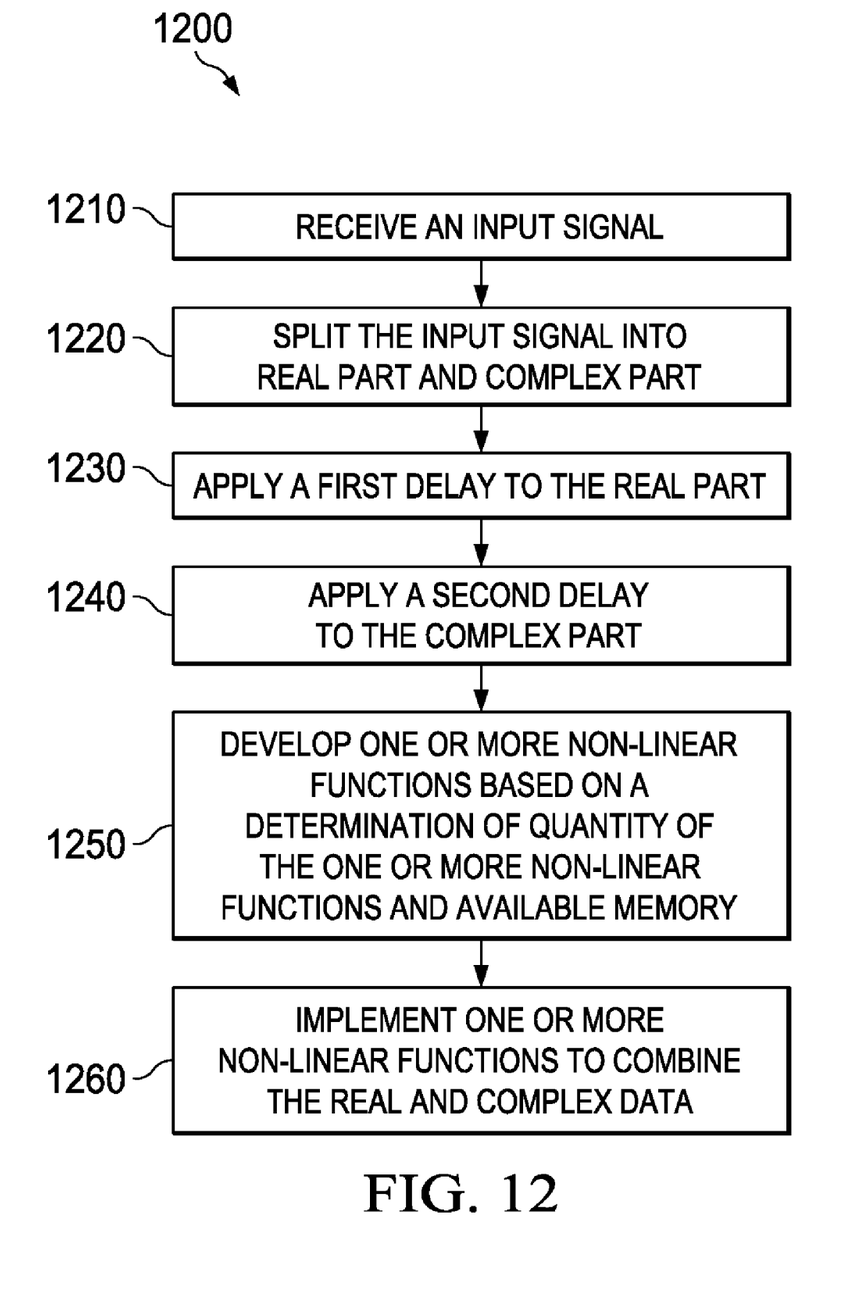
FIG. 12 is a flow diagram of an example of a method of power amplifier pre-distortion.

FIG. 12 provides a flow diagram for an example method 1200 of power amplifier digital pre-distortion. In block 1210, an input signal is received. In block 1220, the input signal is split into a real part and a complex part. In block 1230, a first delay is applied to the real part. In block 1240, a second delay is applied to the complex part. In block 1250, one or more non-linear functions are developed based on a determination of quantity of the one or more non-linear functions and available memory. In block 1260, the one or more non-linear functions are implemented to combine the real and complex data.

The flow chart of FIG. 12 shows the architecture, functionality, and operation of a possible implementation of the digital pre-distortion software. In this regard, each block represents a module, segment, or portion of code, which comprises one or more executable instructions for implementing the specified logical function(s). It should also be noted that in some alternative implementations, the functions noted in the blocks may occur out of the order noted in FIG. 12. For example, two blocks shown in succession in FIG. 12 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Therefore, at least the following is claimed:

1. An apparatus comprising:
   an input-to-index (I2I) module that maps a complex input into a real signal;
   a real data tap delay line that is coupled to the I2I module, wherein the real data tap line includes N delay elements;
   a complex data tap delay line that is configured to receive the complex input, wherein the complex data tap delay line includes M delay elements;
   a set of K non-linear function modules, each non-linear function module from the set has at least one real input, at least one complex input, and at least one complex output; and
   a configurable connectivity crossbar multiplexer that couples K of the N real tap delay line elements to real inputs of the set non-linear functions and that couples K of the M complex tap delay line elements to complex inputs of the set non-linear function modules.

2. The apparatus of claim 1, wherein at least one of the non-linear function modules is implemented with a look-up table (LUT).

3. The apparatus of claim 1, wherein at least one of the non-linear function modules is implemented with a polynomial.

4. The apparatus of claim 3, wherein the polynomial is approximated with an interpolating LUT, wherein interpolation is performed between LUT entries.

5. The apparatus of claim 1, wherein at least one of the non-linear functions is implemented with a LUT and polynomial to LUT parameters (PTT) engine.

6. The apparatus of claim 5, wherein the PTT engine:
   receives at least one of a polynomial coefficient, a basis function parameter, and a LUT index; and
   calculates parameters of the LUT, and updates the LUT.

7. An apparatus comprising:
   an input processing circuit that is configured to receive an input signal;
   a plurality of digital pre-distortion (DPD) cells, wherein each DPD cell includes a real delay circuit, a complex delay circuit, and a non-linear circuit, wherein the complex delay circuits from the DPD cells are coupled in series within one another in a complex datapath so as to have a plurality of complex taps, and wherein the real delay circuits from the DPD cells are coupled in series within one another in a real datapath so as to have a plurality of real taps, and wherein the input processing circuit is coupled to the real datapath and the complex datapath;

a crossbar that is coupled to each of the complex taps, each of the real taps, and the non-linear circuit from each DPD cell; and an output circuit that is coupled to the crossbar.

8. The apparatus of claim 7, wherein the input processing circuit further comprises:

a DPD input circuit;

a first multiplexer that is coupled to the complex datapath and the DPD input circuit; and a second multiplexer that is coupled to real datapath and the DPD input circuit.

9. The apparatus of claim 8, wherein the apparatus further comprises:

a mode selection circuit that is coupled to the output circuit; and a finite impulse response (FIR) filter that is coupled to the mode selection circuit.

10. The apparatus of claim 9, wherein the mode selection circuit further comprises a plurality of mode selection multiplexers.

11. The apparatus of claim 10, wherein the crossbar further comprises:

a third multiplexer that is coupled to the plurality of complex taps; and a fourth multiplexer that is coupled to the plurality of real taps.

* * * * *